United States Patent
Yin et al.

(10) Patent No.: US 11,575,043 B1
(45) Date of Patent: Feb. 7, 2023

(54) SEMICONDUCTOR DEVICE AND MANUFACTURING METHOD OF THE SAME

(71) Applicant: Taiwan Semiconductor Manufacturing Company, Ltd., Hsinchu (TW)

(72) Inventors: Yu-Feng Yin, Hsinchu County (TW); Chia-Jung Yu, Hsinchu (TW); Pin-Cheng Hsu, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/383,435

(22) Filed: Jul. 23, 2021

(51) Int. Cl.
| | | |
|---|---|---|
| *H01L 29/78* | (2006.01) | |
| *H01L 21/40* | (2006.01) | |
| *H01L 29/10* | (2006.01) | |
| *H01L 29/08* | (2006.01) | |
| *H01L 29/51* | (2006.01) | |
| *H01L 21/28* | (2006.01) | |

(52) U.S. Cl.
CPC .... *H01L 29/78391* (2014.09); *H01L 29/0843* (2013.01); *H01L 29/1029* (2013.01); *H01L 29/40111* (2019.08); *H01L 29/516* (2013.01)

(58) Field of Classification Search
CPC ........... H01L 29/78391; H01L 29/0843; H01L 29/1029; H01L 29/40111; H01L 29/516
USPC ....................................................... 257/288
See application file for complete search history.

(56) References Cited

U.S. PATENT DOCUMENTS

| 6,762,454 | B1* | 7/2004 | Ibok | ...................... | H01L 29/517 |
|---|---|---|---|---|---|
| | | | | | 257/314 |
| 2003/0193061 | A1* | 10/2003 | Osten | ................ | H01L 21/28185 |
| | | | | | 438/585 |
| 2003/0218223 | A1* | 11/2003 | Nishiyama | .......... | H01L 29/6659 |
| | | | | | 257/E21.345 |
| 2004/0256653 | A1* | 12/2004 | Iwata | ..................... | H01L 27/105 |
| | | | | | 257/E21.663 |
| 2005/0156169 | A1* | 7/2005 | Chu | .................. | H01L 29/41783 |
| | | | | | 438/105 |
| 2007/0010076 | A1* | 1/2007 | Chan | .................... | H01L 21/2252 |
| | | | | | 257/E29.085 |
| 2007/0059877 | A1* | 3/2007 | Koo | ...................... | H01L 29/772 |
| | | | | | 257/E29.039 |
| 2011/0272742 | A1* | 11/2011 | Akiyama | .......... | H01L 29/66462 |
| | | | | | 257/E21.403 |

(Continued)

*Primary Examiner* — Sheikh Maruf
(74) *Attorney, Agent, or Firm* — JCIPRNET

(57) ABSTRACT

A semiconductor device includes a transistor. The transistor includes a gate electrode, a channel layer, a gate dielectric layer, a first source/drain region and a second source/drain region and a dielectric pattern. The channel layer is disposed on the gate electrode. The gate dielectric layer is located between the channel layer and the gate electrode. The first source/drain region and the second source/drain region are disposed on the channel layer at opposite sides of the gate electrode. The dielectric pattern is disposed on the channel layer. The first source/drain region covers a first sidewall and a first surface of the dielectric pattern, and a second sidewall opposite to the first sidewall of the dielectric pattern is protruded from a sidewall of the first source/drain region.

20 Claims, 9 Drawing Sheets

(56) References Cited

U.S. PATENT DOCUMENTS

| | | | |
|---|---|---|---|
| 2013/0037823 A1* | 2/2013 | Kanemura | H01L 27/0688 257/77 |
| 2013/0082309 A1* | 4/2013 | Su | H01L 27/0617 438/300 |
| 2013/0113027 A1* | 5/2013 | Chiang | H01L 29/518 438/300 |
| 2013/0153967 A1* | 6/2013 | Curatola | H01L 29/66462 257/E29.246 |
| 2014/0035040 A1* | 2/2014 | Le Royer | H01L 29/66356 257/365 |

* cited by examiner

SEMICONDUCTOR DEVICE AND MANUFACTURING METHOD OF THE SAME

BACKGROUND

The integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
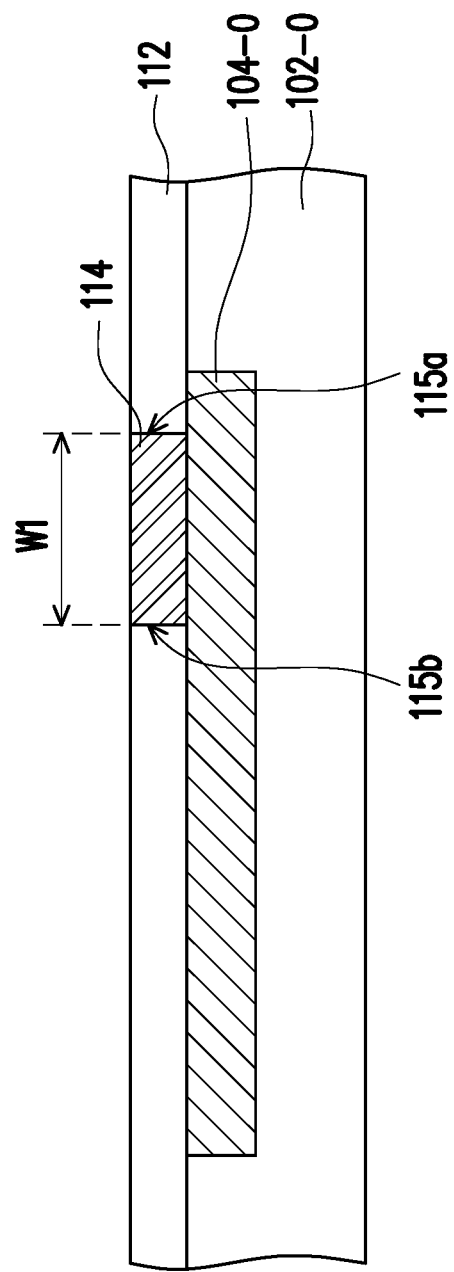
FIG. 1A to FIG. 1F are schematic cross-sectional views illustrating various stages of a manufacturing method of a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are schematic cross-sectional views illustrating various stages of a manufacturing method of a semiconductor device.

Referring to FIGS. 1A to 1E, a transistor T is formed. First, as shown in FIG. 1A, a gate electrode 114 is formed. In some embodiments, the gate electrode 114 is formed on a dielectric layer 102-0 to electrically connect to a conductive feature 104-0. The dielectric layer 102-0 and the conductive feature 104-0 may be parts of an interconnect structure. The dielectric layer 102-0 may be alternatively referred to as an Inter-Metal Dielectric (IMD) layer. In some embodiments, the dielectric layer 102-0 is formed of a low-k dielectric material having a dielectric constant (k-value) lower than about 3.0, about 2.5, or even lower. In some embodiments, the dielectric layer 102-0 is formed of non-low-k dielectric materials such as silicon oxide, silicon carbide (SiC), silicon carbo-nitride (SiCN), silicon oxy-carbo-nitride (SiOCN), or the like. In some alternative embodiments, a material of the dielectric layer 102-0 includes polyimide, epoxy resin, acrylic resin, phenol resin, benzocyclobutene (BCB), polybenzooxazole (PBO), or any other suitable polymer-based dielectric material. The dielectric layer 102-0 may be formed by suitable fabrication techniques such as spin-on coating, chemical vapor deposition (CVD), plasma-enhanced chemical vapor deposition (PECVD), or the like. However, the disclosure is not limited thereto. In some alternative embodiments, the gate electrode 114 is formed over any suitable dielectric layer or substrate and electrically connected to any other suitable device.

In some embodiments, the conductive feature 104-0 is a conductive line. The conductive feature 104-0 is formed in the dielectric layer 102-0. The conductive feature 104-0 may be formed by electroplating, deposition, and/or photolithography and etching. The conductive feature 104-0 may be formed by a single damascene process. For example, a trench is first formed in the dielectric layer 102-0, followed by filling the trench with a conductive material. A planarization process such as a CMP process is then performed to remove the excess portions of the conductive material higher than the top surface of the dielectric layer 102-0, leaving a conductive line in the trench. The conductive material may include a diffusion barrier layer and a copper-containing metallic material over the diffusion barrier layer. The diffusion barrier layer may include titanium, titanium nitride, tantalum, tantalum nitride, or the like.

In some embodiments, a gate electrode 114 is formed in a dielectric layer 112 on the dielectric layer 102-0. Similar to the dielectric layer 102-0, the dielectric layer 112 may be alternatively referred to as an IMD layer. In some embodiments, the material and the formation method of the dielectric layer 112 are similar to those of the dielectric layer 102-0, so the detailed description thereof is omitted herein. In some embodiments, the material and the formation method of the dielectric layer 112 are similar to those of the dielectric layer 102-0, so the detailed description thereof is omitted herein. In some embodiments, the gate electrode 114 is formed by a single damascene process. For example, a trench is first formed in the dielectric layer 112, followed by filling the trench with a metallic material. A planarization process such as a CMP process is then performed to remove the excess portions of the metallic material higher than the top surface of the dielectric layer 112, leaving the gate electrode 114 in the trench. In some alternative embodiments, the gate electrode 114 is formed by a photolithography and etching process. For example, a metallic material (not shown) is conformally formed on the dielectric layer 102-0. In some embodiments, the metallic material is deposited through atomic layer deposition (ALD), CVD, physical vapor deposition (PVD), or the like. Thereafter, a patterned photoresist layer (not shown) is formed on the metallic material to define the shape of the subsequently formed gate electrode 114. Subsequently, an etching process is performed to remove the metallic material that is not covered by the patterned photoresist layer. The etching process includes, for example, an anisotropic etching process such as dry etch or an isotropic etching process such as wet etch. Then, the patterned photoresist layer is removed through a stripping process or the like to expose the remaining metallic material, which constitutes the gate electrode 114.

In some embodiments, the metallic material of the gate electrode 114 includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the gate electrode 114 also includes materials to fine-tune the corresponding work function. For example, the metallic material of the gate electrode 114 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof.

In some embodiments, a barrier layer (not shown) is optionally formed between the gate electrode 114 and the dielectric layer 102-0, so as to avoid diffusion of atoms between elements. In some embodiments, a material of the barrier layer includes titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof.

In some embodiments, a thickness of the gate electrode 114 ranges from about 30 Å to about 250 Å. In some embodiments, a width W1 of the gate electrode 114 ranges from about 50 nm to about 1 μm. The width of the gate electrode 114 may be substantially the same as a distance between opposite sidewalls 115a, 115b of the gate electrode 114.

Figure 1B:
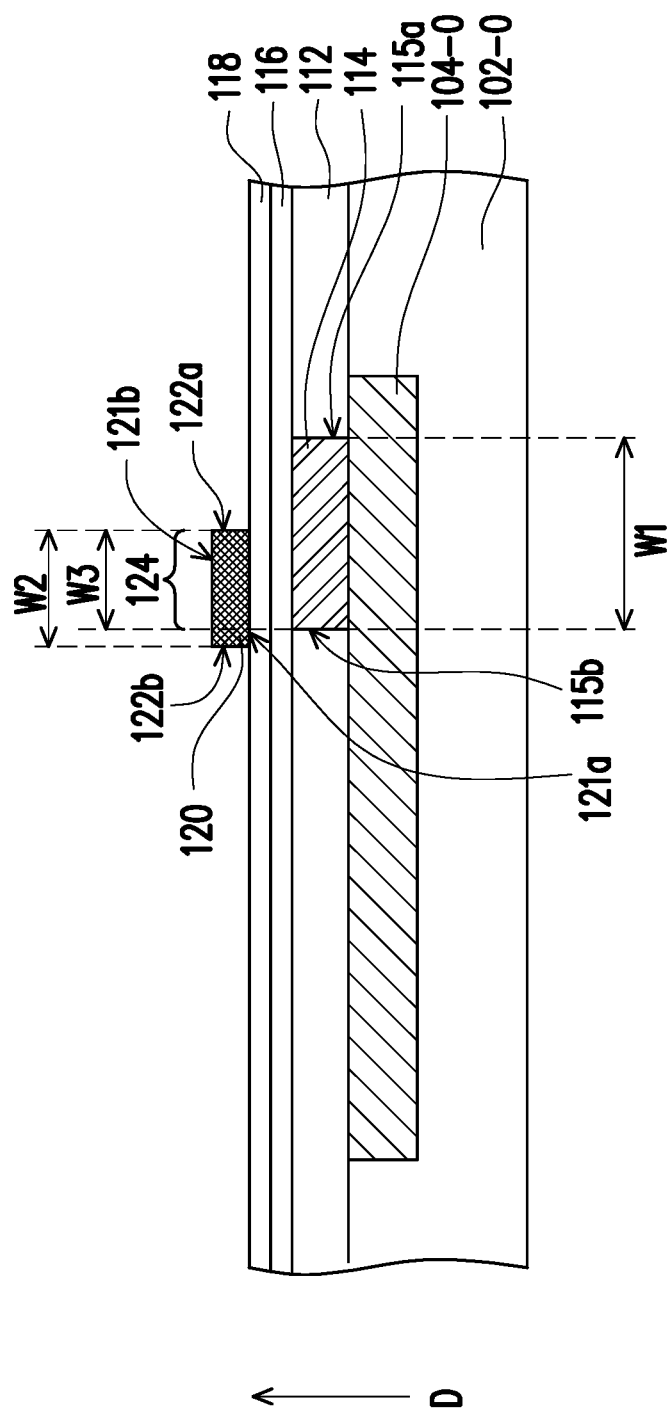

Referring to FIG. 1B, a gate dielectric layer 116 is formed on the gate electrode 114, and a channel layer 118 is formed on the gate dielectric layer 116. In some embodiments, the gate dielectric layer 116 has a thickness ranging from about 50 Å to about 150 Å. In some embodiments, the gate dielectric layer 116 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the gate dielectric layer 116 has a dielectric constant ranging from 20 to 50. In some embodiments, the gate dielectric layer 116 includes metal oxides, metal nitrides, metal silicates, transition metal-oxides, transition metal-nitrides, transition metal-silicates, oxynitrides of metals, metal aluminates, or combinations thereof. For example, the gate dielectric layer 116 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. In some embodiments, the gate dielectric layer 116 is a ferroelectric layer and includes $HfO_2$ doped with Si, $Al_2O_5$, $HfZrO_x$, Ce, La, ZrO, $Pb_3GesO_{11}$ (PGO), lead zirconate titanate (PZT), $SrBi_2Ta_2O_9$ (SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, hafnium silicate, HfAlO, LaAlO, lanthanum oxide, $HfO_2$ doped with Si, $a_2O_5$, $HfZrO_x$, or a combination thereof. The foregoing materials may be deposited by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. However, the disclosure is not limited thereto.

In some embodiments, the channel layer 118 has a thickness ranging from about 20 Å to about 100 Å. In some embodiments, the channel layer 118 includes oxide semiconductor material such as IZO, IGZO, ZnO, InO, GaO, the like, or a combination thereof. In some embodiments, the channel layer 118 is made of a single layer having one of the foregoing materials. However, the disclosure is not limited thereto. In some alternative embodiments, the channel layer 118 may be made of a laminate structure of at least two of the foregoing materials. In some alternative embodiments, the channel layer 118 is doped with a dopant to achieve extra stability. For example, the channel layer 118 may be doped with silicon dopant or the like. In some embodiments, the channel layer 118 is deposited by suitable techniques, such as CVD, ALD, PVD, PECVD, epitaxial growth, or the like.

Then, a dielectric pattern 120 is formed on the channel layer 118, to overlap with the gate electrode 114. In some embodiments, the dielectric pattern 120 includes high-k dielectric materials. It should be noted that the high-k dielectric materials are generally dielectric materials having a dielectric constant higher than 4, greater than about 12, greater than about 16, or even greater than about 20. The material of the dielectric pattern 120 may be the same as or different from the material of the gate dielectric layer 116. The material of the dielectric pattern 120 may be the same as or different from the material of the channel layer 118. In some embodiments, the dielectric constant of the dielectric pattern 120 is larger than the dielectric constant of an IMD layer such as a dielectric layer 126 (which will be described in FIG. 1C). In some embodiments, the water absorption capacity of the dielectric pattern 120 is higher than the water absorption capacity of the IMD layer such as the dielectric layer 126. In some embodiments, the dielectric pattern 120 includes silicon nitride, silicon oxynitride, metal oxides, metal nitrides, metal silicates, transition metal-oxides, transition metal-nitrides, transition metal-silicates, oxynitrides of metals, metal aluminates, or combinations thereof. For example, the dielectric pattern 120 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), gallium oxide (GaO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The dielectric pattern 120 may be formed by depositing a dielectric material and patterning the dielectric material by photolithography and etching. The dielectric material may be deposited by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. However, the disclosure is not limited thereto.

The dielectric pattern 120 has a surface 121a facing the gate electrode 114 and a surface 121b opposite to the surface 121a. The surface 121a is a bottom surface, and the surface 121b is a top surface, for example. The height H of the dielectric pattern 120 is measured between the opposite surfaces 121a, 121b. In some embodiments, the height H of the dielectric pattern 120 ranges from about 50 Å to about 200 Å. The dielectric pattern 120 has opposite sidewalls 122a, 122b, and a width W2 of the dielectric pattern 120 may be substantially equal to a distance between the sidewalls 122a, 122b. The width W2 of the dielectric pattern 120 may range from 10 nm to 500 nm. In some embodiments, the dielectric pattern 120 is plate-shaped.

In some embodiments, the dielectric pattern 120 is partially overlapped with the gate electrode 114. For example, in a direction D (e.g., a vertical direction), at least one of the sidewalls 122a, 122b is directly on or overlapped with the gate electrode 114. The direction D is also referred to as a stacking direction of the gate electrode 114, the channel layer 118 and the dielectric pattern 120, for example. In some embodiments, the sidewall 122a of the dielectric pattern 120 is disposed between the opposite sidewalls 115a, 115b of the gate electrode 114 and overlapped with the gate electrode 114. In some embodiments, the sidewall 122b is not directly on or overlapped with the gate electrode 114. In some embodiments, a portion 124 of the dielectric pattern 120 is overlapped with the gate electrode 114 and has a width W3. The width W3 of the portion 124 may be less than or substantially equal to the width W2 of the dielectric pattern 120. The width W3 is in a range of about 50 Å to about 200 Å, for example. However, the disclosure is not limited thereto. In some alternative embodiments, the dielectric pattern 120 is entirely overlapped with the gate electrode 114 or not overlapped with the gate electrode 114.

Figure 1C:
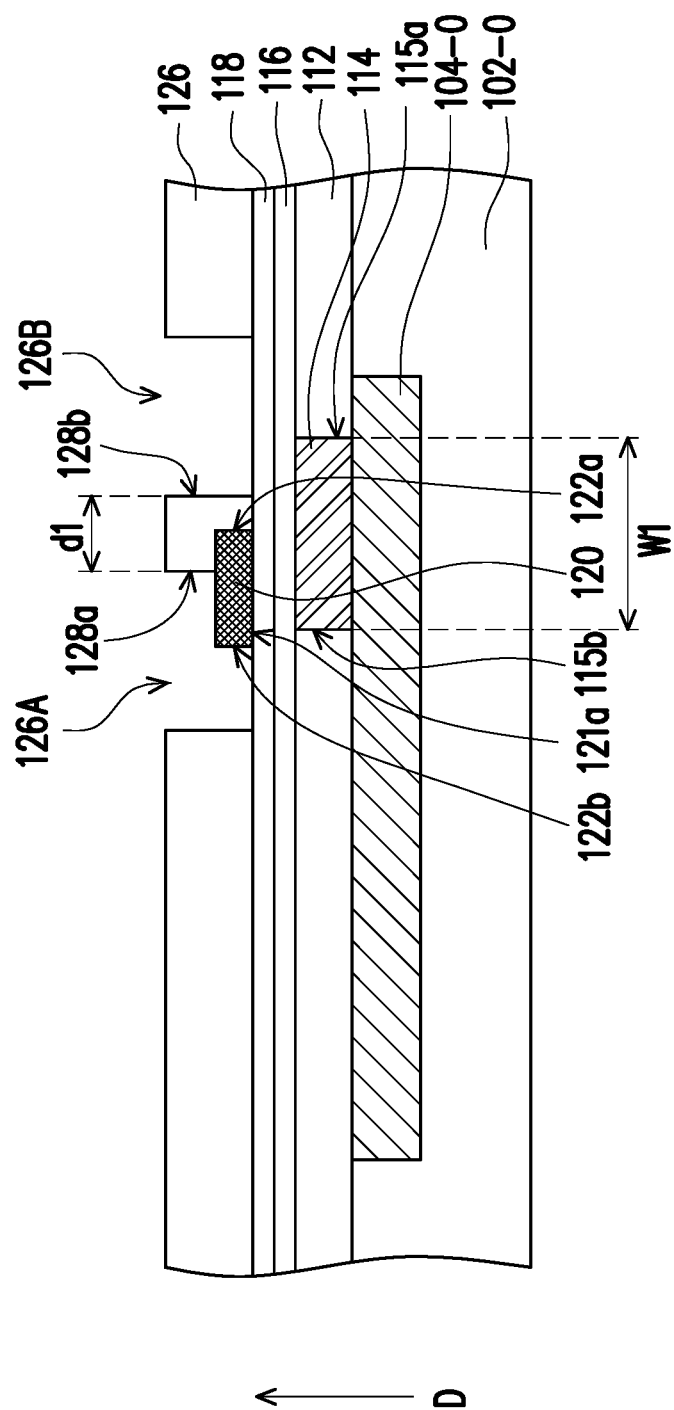

Referring to FIG. 1C, a dielectric layer 126 is formed on the channel layer 118, to cover portions of the channel layer 118 and the dielectric pattern 120. Similar to the dielectric layer 102-0, the dielectric layer 126 may be alternatively referred to as an IMD layer. In some embodiments, the material and the formation method of the dielectric layer 126 are similar to those of the dielectric layer 102-0, so the detailed description thereof is omitted herein. In some embodiments, the dielectric layer 126 includes a plurality of openings 126A, 126B. The openings 126A, 126B may be formed by photolithography and etching. The openings 126A, 126B are formed at opposite sides of the gate electrode 114, and thus the openings 126A, 126B expose the channel layer 118 on the opposite sides of the gate electrode 114. In some embodiments, one portion of the dielectric pattern 120 is covered by the dielectric layer 126, and the other portion of the dielectric pattern 120 is exposed by the opening 126A. For example, the portion 124 of the dielectric pattern 120 is partially exposed by the opening 126A. The sidewall 122a may be disposed between the sidewalls 128a, 128b. In some embodiments, the openings 126A, 126B are partially overlapped with the gate electrode 114 therebeneath. For example, in the direction D, a sidewall 128a of the opening 126A is directly on or overlapped with the gate electrode 114, and a sidewall 128b of the opening 126B is directly on or overlapped with the gate electrode 114. The sidewalls 128a and 128b are respectively disposed between the sidewalls 115a, 115b of the gate electrode 114, for example. In such embodiments, a distance d1 between the sidewall 128a of the opening 126A and the sidewall 128b of the opening 126B is smaller than the width W1 of the gate electrode 114. The distance d1 may be in a range of about 5 Å to about 1000 Å. However, the disclosure is not limited thereto. In some alternative embodiments, the openings 126A, 126B are not overlapped with the gate electrode 114 therebeneath. In such embodiments, the distance d1 between the sidewall 128a of the opening 126A and the sidewall 128b of the opening 126B is substantially equal to or larger than the width W1 of the gate electrode 114.

Figure 1D:
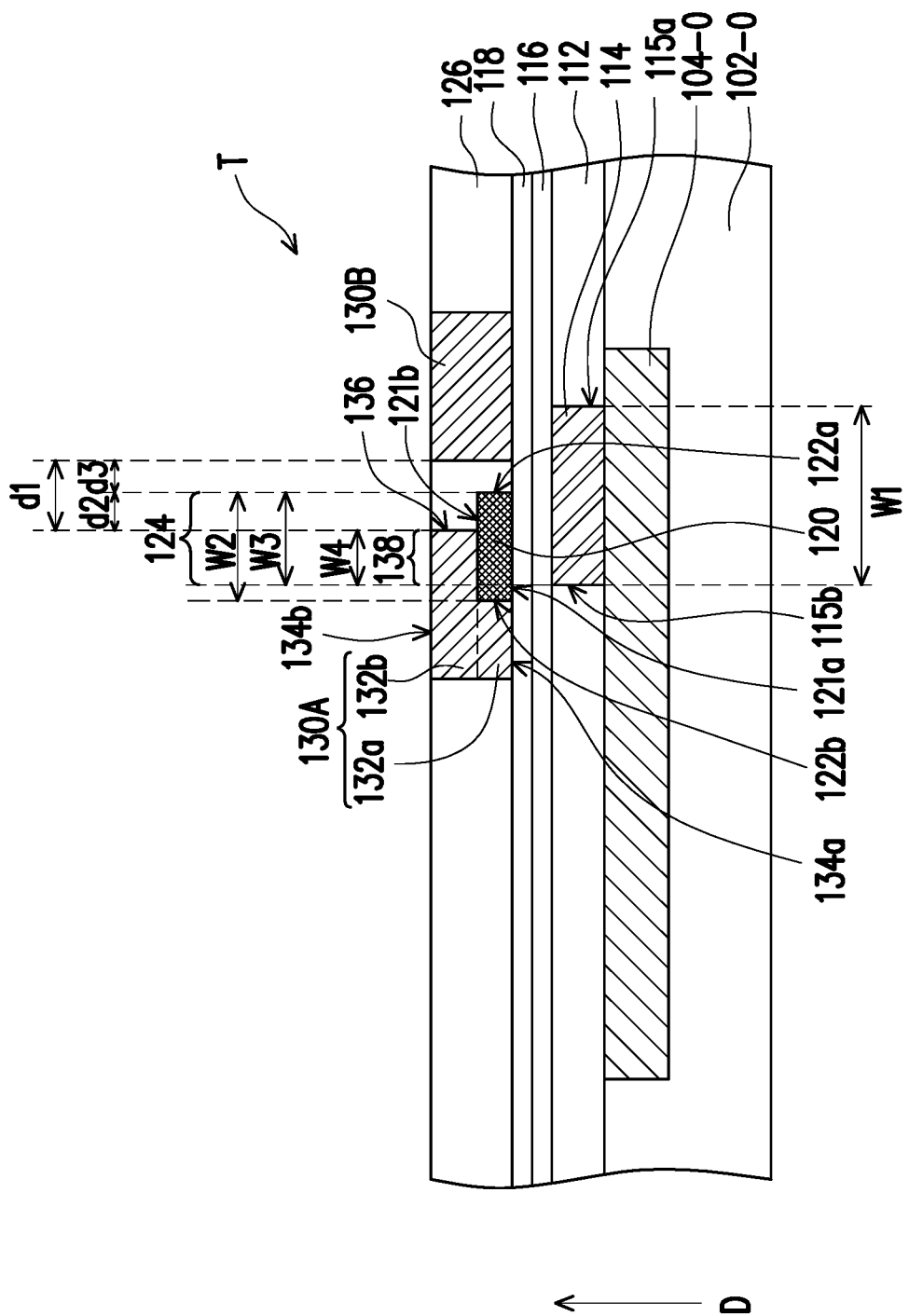

Referring to FIG. 1D, source/drain regions 130A, 130B are formed in the openings 126A, 126B respectively. The source/drain regions 130A, 130B are formed on the channel layer 118 at opposite sides of the gate electrode 114. In some embodiments, a material of the source/drain regions 130A, 130B includes cobalt, tungsten, copper, titanium, tantalum, aluminum, zirconium, hafnium, a combination thereof, or other suitable metallic materials. In some embodiments, the source/drain regions 130A, 130B are formed through CVD, ALD, plating, or other suitable deposition techniques. In some embodiments, the source/drain regions 130A, 130B are formed to have a thickness ranging from about 100 Å to about 1000 Å.

In some embodiments, the source/drain region 130A is formed to cover the channel layer 118 and the dielectric pattern 120. The source/drain region 130A may be in direct contact with the sidewall 122b and the surface 121b of the dielectric pattern 120. In some embodiments, the source/drain region 130A has a first portion 132a and a second portion 132b. The first portion 132a is disposed immediately adjacent to the dielectric pattern 120, and the second portion 132b is disposed on the first portion 132a and the dielectric pattern 120, for example. A width of the second portion 132b is larger than a width of the first portion 132a. The width of the first portion 132a and the second portion 132b may be in a range from 20 nm to 500 nm, respectively. A width difference between the first and second portions 132a and 132b may be in a range of about 10 Å to about 500 Å. The source/drain region 130A, 130B has a surface 134a facing the gate electrode 114 and a surface 134b opposite to the surface 134a. The surface 134a is a bottom surface, and the surface 134b is a top surface, for example. The surface 134a of the source/drain region 130A may be substantially coplanar with the surface 134a of the source/drain region 130B, and the surface 134b of the source/drain region 130A may be substantially coplanar with the surface 134b of the source/drain region 130B, for example. In some embodiments, the surface 121a of the dielectric pattern 120 is substantially coplanar with the surface 134a of the source/drain region 130A and the surface 134b of the source/drain region 130B. The surface 121b of the dielectric pattern 120 is covered by the source/drain region 130A and disposed between the opposite surfaces 134a, 134b of the source/drain region 130A.

In some embodiments, the sidewall 122b of the dielectric pattern 120 is in direct contact with the source/drain region 130A, and the sidewall 122a is protruded from a sidewall 136 of the source/drain region 130A. In other words, the dielectric pattern 120 is inserted into and/or partially embedded in the source/drain region 130A. For example, the dielectric pattern 120 extends towards the source/drain region 130B beyond the sidewall 136 of the source/drain region 130A. In some embodiments, a distance d2 between the sidewall 136 of the source/drain region 130A and the sidewall 122a of the dielectric pattern 120 is in a range of about 0 Å to about 500 nm. In some embodiments, a distance d3 between the sidewall 122a of the dielectric pattern 120 and the source/drain region 130B is in a range about 10 Å to about 100 Å. A total of the distance d2 and the distance d3 is substantially equal to the distance d1 between the source/drain regions 130A and 130B. The sidewall 136 of the source/drain region 130A is disposed between the opposite sidewalls 122a, 122b of the dielectric pattern 120, and the sidewall 121b is disposed between adjacent sidewalls of the source/drain regions 130A and 130B.

In some embodiments, in the direction D, a portion 138 of the second portion 132b is disposed on the dielectric pattern 120 and overlapped with the gate electrode 114. In some embodiments, the direction D is also referred to as the stacking direction of the gate electrode 114, the channel layer 118 and the source/drain regions 130A, 130B. The portion 138 is also referred to as an extended portion or an overlapped portion. For example, as shown in FIG. 1D, the portion 138 is overlapped with both the gate electrode 114. In other words, in the direction D, a projection of the portion 138 onto a bottom surface of the dielectric layer 102-0 may be overlapped with a projection of the gate electrode 114 onto the bottom surface of the dielectric layer 102-0. In some embodiments, the portion 138 overlapped with the gate electrode 114 has a width W4. The width W4 may be in a range of about 0 to about 500 nm. The width W4 is smaller than the width W3 of the portion 124 of the dielectric pattern 120. In some embodiments, by forming the dielectric pattern 120, the source/drain region 130A further extend towards the source/drain region 130B, and the distance (i.e., distance d1) between the source/drain regions 130A and 130B is reduced. It is noted that although the dielectric pattern 120 is illustrated as being inserted into/embedded in the source/drain region 130A, the disclosure is not limited thereto. In some alternative embodiments, the dielectric pattern 120 is formed to insert into/embed in the source/drain region 130B. In addition, in some alternative embodiments (not shown), the source/drain regions 130A, 130B respectively have the dielectric pattern 120 embedded therein. In such embodiments, the dielectric pattern 120 in the source/drain region 130B extends towards the source/drain region 130A beyond the sidewall of the source/drain region 130B, and a distance between the dielectric patterns 120 is smaller than the distance between the source/drain region 130A and the source/drain region 130B.

In some embodiments, after forming the source/drain regions 130A, 130B, a transistor T is formed. In some embodiments where the gate dielectric layer 116 is a ferroelectric layer, the transistor T is a ferroelectric field-effect transistor (FeFET). In some embodiments, by forming the dielectric pattern 120, the source/drain region 130A further extends towards the source/drain region 130B to overlap with the gate electrode 114 therebeneath. Since the source/drain region 130A is partially overlapped with the gate electrode 114, a more uniform electric field (E-field) may be created across the gate dielectric layer 116 and the channel layer 118 between the gate electrode 114 and the source/drain region 130A (e.g., the portion 138 of the source/drain region 130A). Thus, the E-field may be sufficient to achieve a coercive field (Ec) to switch the ferroelectric material in the ferroelectric layer (e.g., the gate dielectric layer 116), which results in good remanent polarization (Pr). For example, the coercive field (Ec) is formed along a desired direction such as the direction D. In other words, by forming the dielectric pattern, the control of the gate electrode on the FeFET may be improved, and thus the polarization of the ferroelectric material is enhanced. In addition, the dielectric pattern may have good water absorption capacity, and thus the gas and/or the water vapor which exists in the environment or is formed during the processing may be reduced. Accordingly, the channel layer may be prevented from being influenced by the humidity.

Figure 1E:
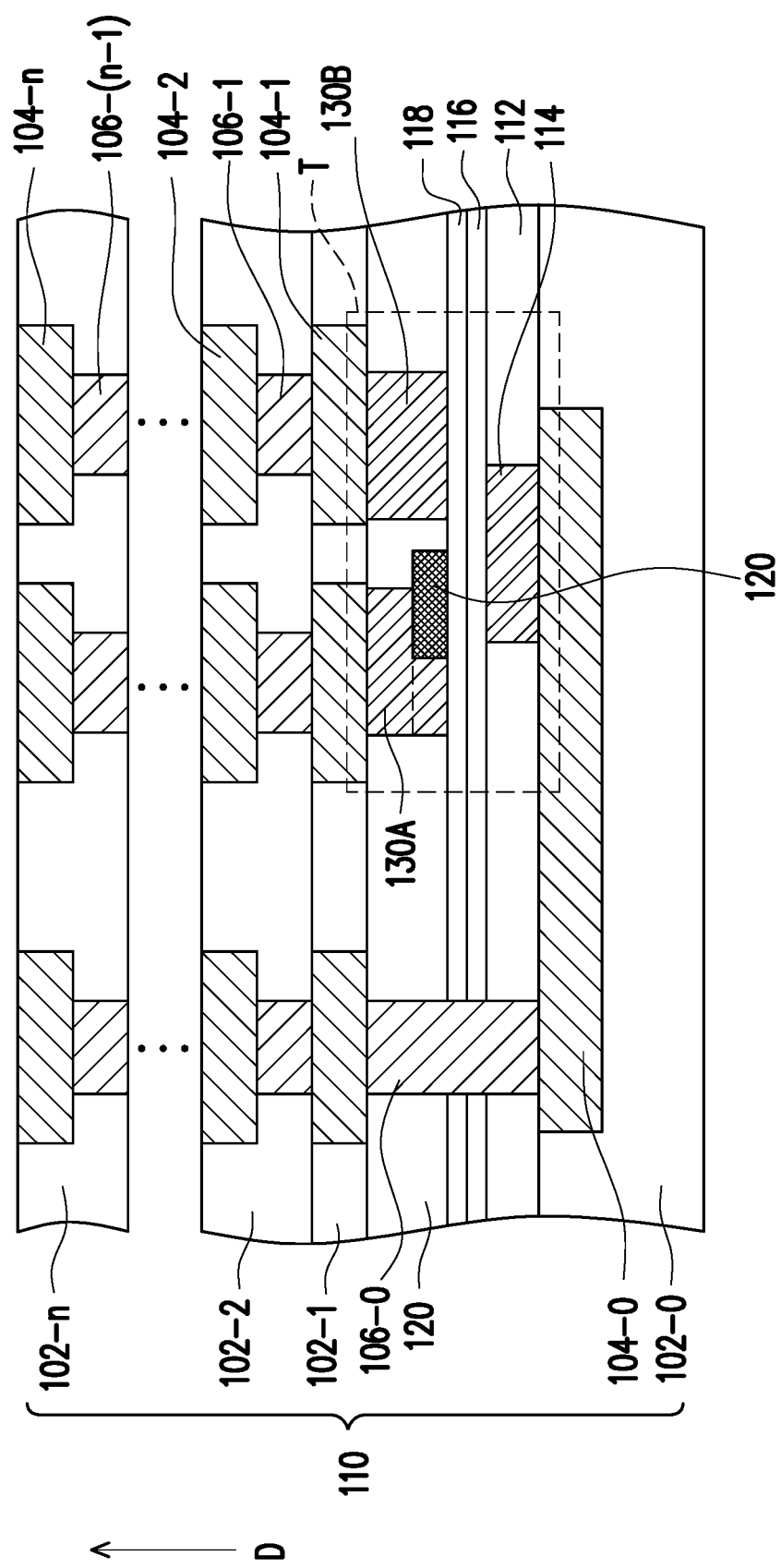

Referring to FIG. 1E, an interconnect structure 110 is formed to electrically connect the transistor T. In some embodiments, the interconnect structure 110 includes a plurality of dielectric layers 102-0, 102-1, 102-2, . . . , 102-n and a plurality of conductive features 104-0, 104-1, 104-2, . . . , 104-n, 106-0, 106-1, . . . , 106-(n−1). The dielectric layers 102-0, 102-1, 102-2, . . . , 102-n may be alternatively referred to as IMD layers. The conductive features 104-0, 104-1, 104-2, . . . , 104-n, 106-0, 106-1, . . . , 106-(n−1) may be conductive line or conductive via respectively. For example, the conductive features 104-0, 104-1, 104-2, . . . , 104-n are conductive lines, and the conductive features 106-0, 106-1, . . . , 106-(n−1) are conductive vias. In some embodiments, the conductive features 104-0, 104-1 establishes electrical connection between the transistor T and the interconnect structure 110. For example, the conductive feature 104-0 is electrically connected to the gate electrode 114, and the conductive features 104-1 are electrically connected to the source/drain regions 130A, 130B. However, the disclosure is not limited thereto. In some alternative embodiments, a conductive via is formed between the conductive feature 104-0 and the gate electrode 114 and/or between the conductive features 104-1 and the source/drain regions 130A, 130B. In addition, as mentioned above, the gate electrode 114 may be electrically connected any other suitable device.

Parts of the interconnect structure 110 may be formed before, during or after forming the transistor T. For example, the dielectric layer 102-0 and the conductive feature 104-0 are formed before forming the transistor T. In some embodiments, the conductive feature 106-0 is formed aside the transistor T. The conductive feature 106-0 is formed in the dielectric layer 112, the gate dielectric layer 116, the channel layer 118 and the dielectric layer 126, for example. The conductive feature 106-0 may be formed simultaneously with the source/drain regions 130A, 130B. For example, after forming the dielectric pattern 120, a via opening is formed in the dielectric layer 112, the gate dielectric layer 116, the channel layer 118 and the dielectric layer 126, followed by filling the via opening and the openings 126A, 126B with a conductive material. A planarization process such as a CMP process is then performed to remove the excess portions of the conductive material higher than the top surface of the dielectric layer 126, leaving the conductive feature 106-0 in the via opening and the source/drain regions 130A, 130B in the openings 126A, 126B. In some alternative embodiments, the conductive feature 106-0 and the source/drain regions 130A, 130B are separately formed.

In some embodiments, the dielectric layers 102-1, 102-2, . . . , 102-n and the conductive features 104-1, 104-2, . . . , 104-n, 106-1, . . . , 106-(n−1) are formed after forming the transistor T. In some embodiments, the material and the formation of the dielectric layer 102-1, 102-2, . . . , 102-n and the conductive features 104-1, 104-2, . . . , 104-n, 106-0, 106-1, . . . , 106-(n−1) are similar to those of the dielectric layer 102-0 and the conductive feature 104-0, so the detailed description thereof is omitted herein. The main difference lies in the conductive features 104-2, . . . , 104-n, 106-1, . . . , 106-(n−1) may be formed by a dual damascene process. For example, the conductive feature 104-2 and the underlying conductive feature 106-1 are formed simultaneously by a dual damascene process, and similarly, the conductive feature 104-*n* and the underlying conductive feature 106-(*n*−1) are formed simultaneously by a dual damascene process. However, the disclosure is not limited thereto. It should be noted that the number of the dielectric layers 102-0, 102-1, 102-2, . . . , 102-*n* and the number of the conductive features 104-0, 104-1, 104-2, . . . , 104-*n*, 106-0, 106-1, . . . , 106-(*n*−1) illustrated in FIG. 1E are merely for illustrative purposes, and the disclosure is not limited thereto. In some alternative embodiments, fewer or more layers of the dielectric layers 102-0, 102-1, 102-2, . . . , 102-*n* and/or the number of the conductive features 104-0, 104-1, 104-2, . . . , 104-*n*, 106-0, 106-1, . . . , 106-(*n*−1) may be formed depending on the circuit design.

Figure 1F:
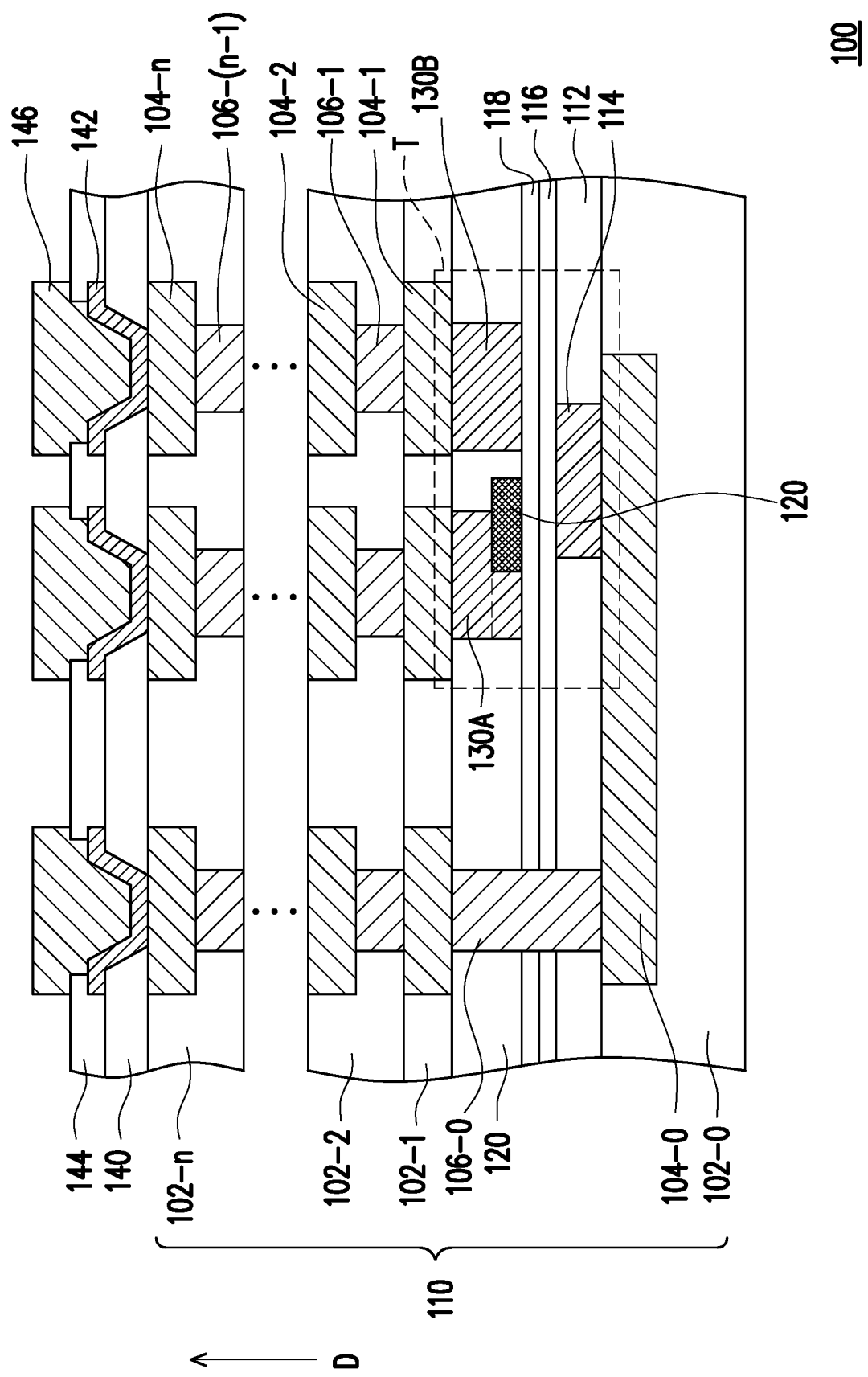

Referring to FIG. 1F, in some embodiments, after forming the interconnect structure 110, a passivation layer 140, a plurality of conductive pads 142, a post-passivation layer 144 and a plurality of conductive terminals 146 are sequentially formed. Then, a semiconductor device 100 may be formed. In some embodiments where the transistor is FeFET, the semiconductor device 100 is a FeFET-based device such as a FeRAM. In such embodiments, the ferroelectric layer is also referred to as a "storage layer."

In some embodiments, the passivation layer 140 is disposed on the topmost dielectric layer 102-*n* and the topmost conductive features 104-*n*. In some embodiments, the passivation layer 140 has a plurality of openings partially exposing each topmost conductive features 104-*n*. In some embodiments, the passivation layer 140 is a silicon oxide layer, a silicon nitride layer, a silicon oxy-nitride layer, or a dielectric layer formed by other suitable dielectric materials. The passivation layer 140 may be formed by suitable fabrication techniques such as HDP-CVD, PECVD, or the like.

In some embodiments, the conductive pads 142 are formed over the passivation layer 140. In some embodiments, the conductive pads 142 extend into the openings of the passivation layer 140 to be in direct contact with the topmost conductive features 104-*n*. That is, the conductive pads 142 are electrically connected to the interconnect structure 110. In some embodiments, the conductive pads 142 include aluminum pads, copper pads, titanium pads, nickel pads, tungsten pads, or other suitable metal pads. The conductive pads 142 may be formed by, for example, electroplating, deposition, and/or photolithography and etching. It should be noted that the number and the shape of the conductive pads 142 illustrated in FIG. 1F are merely for illustrative purposes, and the disclosure is not limited thereto. In some alternative embodiments, the number and the shape of the conductive pad 142 may be adjusted based on demand.

In some embodiments, the post-passivation layer 144 is formed over the passivation layer 140 and the conductive pads 142. In some embodiments, the post-passivation layer 144 is formed on the conductive pads 142 to protect the conductive pads 142. In some embodiments, the post-passivation layer 144 has a plurality of contact openings partially exposing each conductive pad 142. The post-passivation layer 144 may be a polyimide layer, a PBO layer, or a dielectric layer formed by other suitable polymers. In some embodiments, the post-passivation layer 144 is formed by suitable fabrication techniques such as HDP-CVD, PECVD, or the like.

As illustrated in FIG. 1F, the conductive terminals 146 are formed over the post-passivation layer 144 and the conductive pads 142. In some embodiments, the conductive terminals 146 extend into the contact openings of the post-passivation layer 144 to be in direct contact with the corresponding conductive pad 142. That is, the conductive terminals 146 are electrically connected to the interconnect structure 110 through the conductive pads 142. In some embodiments, the conductive terminals 146 are conductive pillars, conductive posts, conductive balls, conductive bumps, or the like. In some embodiments, a material of the conductive terminals 146 includes a variety of metals, metal alloys, or metals and mixture of other materials. For example, the conductive terminals 146 may be made of aluminum, titanium, copper, nickel, tungsten, tin, and/or alloys thereof. The conductive terminals 146 are formed by, for example, deposition, electroplating, screen printing, or other suitable methods. In some embodiments, the conductive terminals 146 are used to establish electrical connection with other components (not shown) subsequently formed or provided.

In some embodiments, as shown in FIG. 1D, the dielectric pattern 120 is partially overlapped with the gate electrode 114. However, the disclosure is not limited thereto. In other words, the semiconductor device 100 may have any other suitable transistor such as transistors of FIGS. 2 and 3.

Figure 2:
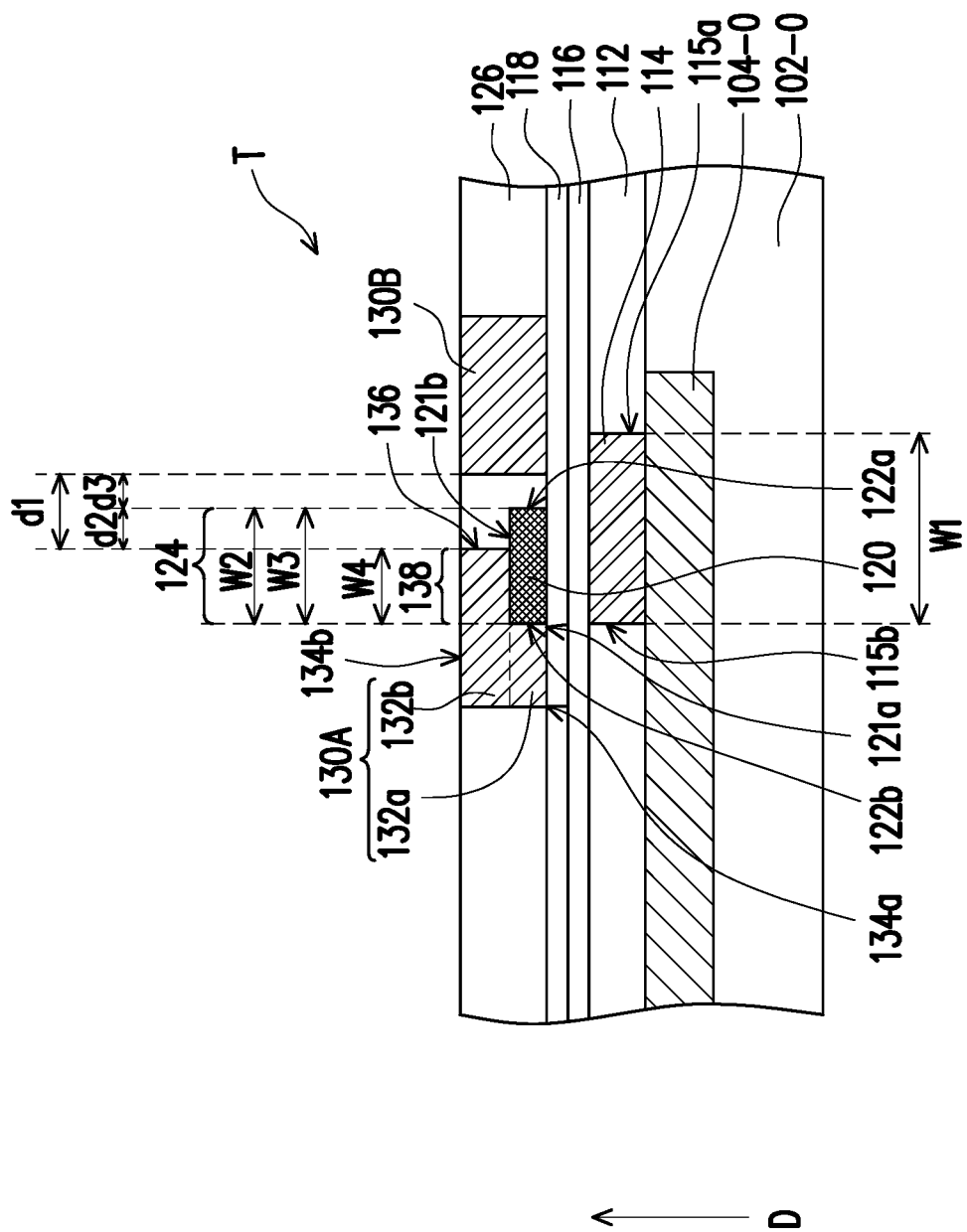
FIG. 2 is a cross-sectional view of a transistor of a semiconductor device in accordance with some alternative embodiments of the disclosure.

FIG. 2 is a cross-sectional view of a transistor of a semiconductor device in accordance with some alternative embodiments of the disclosure. Referring to FIG. 2, the transistor T in FIG. 2 is similar to the transistor T in FIG. 1D, so similar elements are denoted by the same reference numeral and the detailed description thereof is omitted herein. The main difference lies in the dielectric pattern 120 is entirely overlapped with the gate electrode 114, for example. In some embodiments, in the direction D, the opposite sidewalls 122*a*, 122*b* of the dielectric pattern 120 are both directly on and overlapped with the gate electrode 114. In some embodiments, as shown in FIG. 2, the sidewall 122*b* of the dielectric pattern 120 is substantially flush with the sidewall 115*a* of the gate electrode 114. However, the disclosure is not limited thereto. In some alternative embodiments, the opposite sidewalls 122*a*, 122*b* of the dielectric pattern 120 are disposed between the opposite sidewalls 115*a*, 115*b* of the gate electrode 114. In some embodiments, the dielectric pattern 120 is entirely overlapped with the gate electrode 114 therebeneath, and a total area of the portion 138 of the source/drain region 130A overlapped with the gate electrode 114 is accordingly increased. Therefore, the control of the gate electrode on the FeFET may be improved, and the polarization of the ferroelectric material in the ferroelectric layer (e.g., the gate dielectric layer 116) is enhanced.

Figure 3:
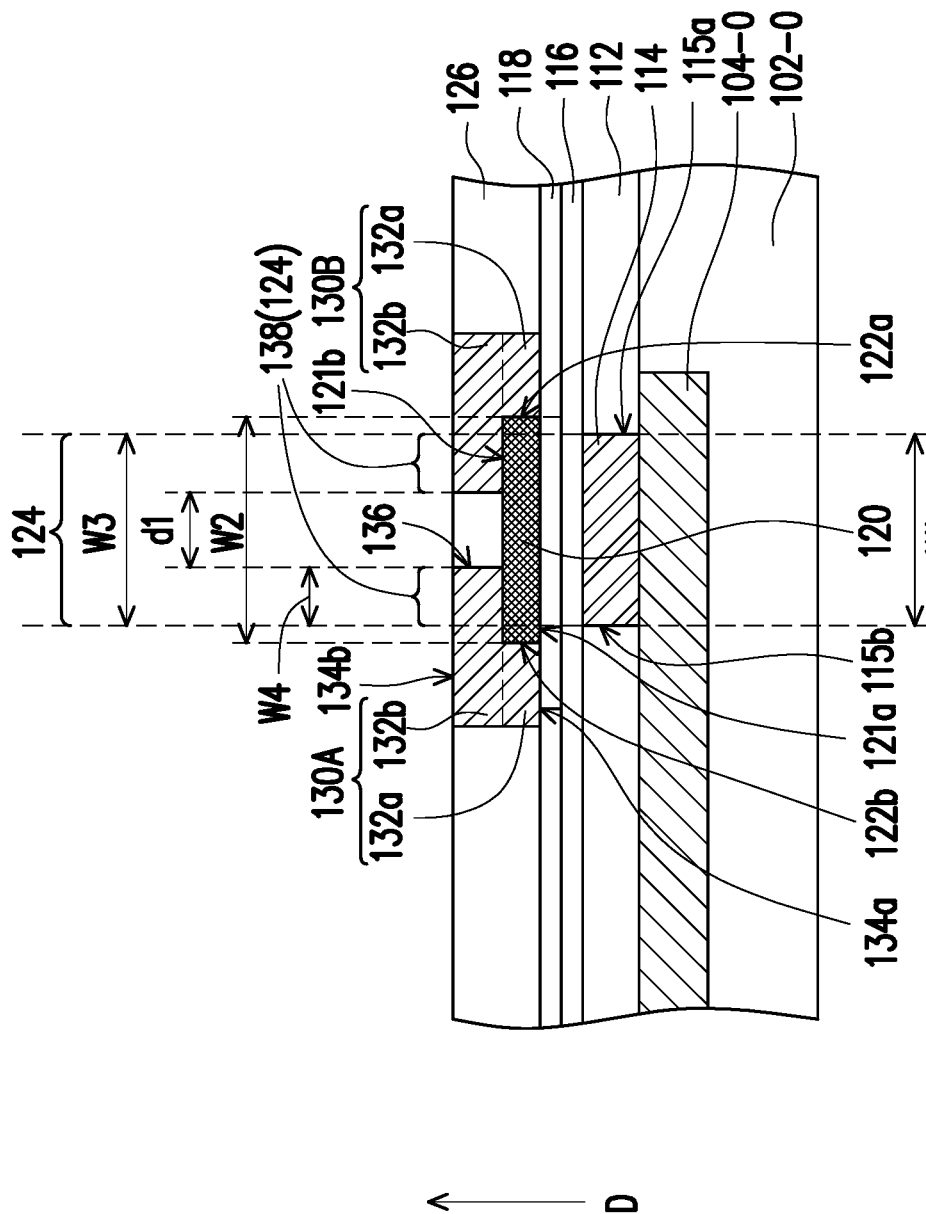
FIG. 3 is a cross-sectional view of a transistor of a semiconductor device in accordance with some alternative embodiments of the disclosure.

FIG. 3 is a cross-sectional view of a transistor of a semiconductor device in accordance with some alternative embodiments of the disclosure. Referring to FIG. 3, the transistor T in FIG. 3 is similar to the transistor T in FIG. 1D, so similar elements are denoted by the same reference numeral and the detailed description thereof is omitted herein. The main difference lies in the dielectric pattern 120 of FIG. 3 further inserts into the source/drain region 130B. In other words, the dielectric pattern 120 is continuously disposed between and under the source/drain region 130A and the source/drain region 130B at opposite sides of the gate electrode 114. In some embodiments, similar to the source/drain region 130A, the source/drain region 130B has a first portion 132*a* and a second portion 132*b* on the first portion and the dielectric pattern 120, and the second portion 132*b* has a portion 138 overlapped with the gate electrode 114. The first portion 132*a*, the second portion 132*b* and the portion 138 of the source/drain region 130B are similar to those of the source/drain region 130A, so the detailed description thereof is omitted herein. In such embodiments, since both the source/drain regions 130A, 130B are both partially overlapped with the gate electrode 114, a more uniform electric field (E-field) may be created across the gate dielectric layer 116 and the channel layer 118 between the gate electrode 114 and the source/drain region 130A, 130B (e.g., the portion 138 of the source/drain region 130A, 130B) respectively. Thus, the control of the gate electrode on the FeFET may be enhanced. In addition, a water absorption capacity of the dielectric pattern 120 may be improved as the total volume thereof is increased. Accordingly, the channel layer may be prevented from being influenced by the humidity.

Figure 4:
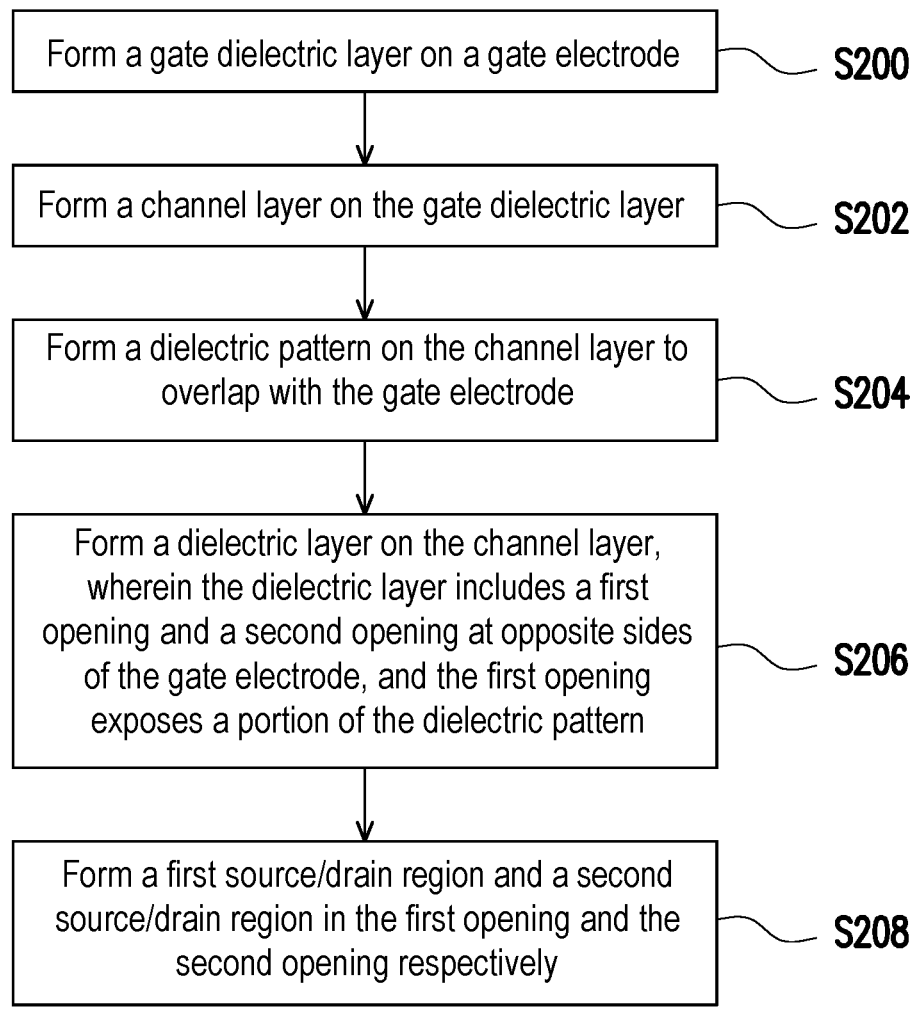
FIG. 4 illustrates a method of forming a semiconductor device in accordance with some embodiments.

FIG. 4 illustrates a method of forming a semiconductor device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S200, a gate dielectric layer is formed on a gate electrode. FIGS. 1A, 2 and 3 illustrate varying views corresponding to some embodiments of act S200.

At act S202, a channel layer is formed on the gate dielectric layer. FIGS. 1B, 2 and 3 illustrate varying views corresponding to some embodiments of act S202.

At act S204, a dielectric pattern is formed on the channel layer to overlap with the gate electrode. FIGS. 1B, 2 and 3 illustrate varying views corresponding to some embodiments of act S204.

At act S206, a dielectric layer is formed on the channel layer, the dielectric layer includes a first opening and a second opening at opposite sides of the gate electrode, and the first opening exposes a portion of the dielectric pattern. FIGS. 1C, 2 and 3 illustrate varying views corresponding to some embodiments of act S206.

At act S208, a first source/drain region and a second source/drain region are formed in the first opening and the second opening respectively. FIGS. 1D, 2 and 3 illustrate varying views corresponding to some embodiments of act S208.

In accordance with some embodiments of the disclosure, a semiconductor device includes a transistor. The transistor includes a gate electrode, a channel layer, a gate dielectric layer, a first source/drain region and a second source/drain region and a dielectric pattern. The channel layer is disposed on the gate electrode. The gate dielectric layer is located between the channel layer and the gate electrode. The first source/drain region and the second source/drain region are disposed on the channel layer at opposite sides of the gate electrode. The dielectric pattern is disposed on the channel layer. The first source/drain region covers a first sidewall and a first surface of the dielectric pattern, and a second sidewall opposite to the first sidewall of the dielectric pattern is protruded from a sidewall of the first source/drain region.

In accordance with some embodiments of the disclosure, a semiconductor device includes a ferroelectric field-effect transistor (FeFET). The FeFET includes a gate electrode, a channel layer, a ferroelectric layer, a first source/drain region and a second source/drain region and a dielectric pattern. The channel layer is disposed on the gate electrode. The ferroelectric layer is located between the channel layer and the gate electrode. The first source/drain region and the second source/drain region are disposed on the channel layer at opposite sides of the gate electrode. The dielectric pattern is inserted between the channel layer and the first source/drain region. The dielectric pattern is partially covered by the first source/drain region and overlapped with the gate electrode.

In accordance with some embodiments of the disclosure, a manufacturing method of a semiconductor device includes following steps. A gate dielectric layer on a gate electrode. A channel layer is formed on the gate dielectric layer. A dielectric pattern is formed on the channel layer to overlap with the gate electrode. A dielectric layer is formed on the channel layer, the dielectric layer includes a first opening and a second opening at opposite sides of the gate electrode, and the first opening exposes a portion of the dielectric pattern. A first source/drain region and a second source/drain region are formed in the first opening and the second opening respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a transistor comprising:
      a gate electrode;
      a channel layer on the gate electrode;
      a gate dielectric layer located between the channel layer and the gate electrode;
      a first source/drain region and a second source/drain region on the channel layer at opposite sides of the gate electrode; and
      a dielectric pattern on the channel layer, wherein the first source/drain region covers a first sidewall and a first surface of the dielectric pattern, and a second sidewall opposite to the first sidewall of the dielectric pattern is protruded from a sidewall of the first source/drain region.

2. The semiconductor device of claim 1, wherein the gate electrode, the channel layer and the first and second source/drain regions are stacked in a first direction, and the dielectric pattern is overlapped with the gate electrode in the first direction.

3. The semiconductor device of claim 2, wherein the dielectric pattern is entirely overlapped with the gate electrode in the first direction.

4. The semiconductor device of claim 1 further comprising a dielectric layer on the channel layer aside the first and second source/drain regions, wherein a k value of the first spacer is larger than a k value of the dielectric layer.

5. The semiconductor device of claim 1 further comprising a dielectric layer on the channel layer, wherein the dielectric layer is disposed between the first and second source/drain regions and covers a portion of the dielectric pattern protruded from the first source/drain region.

6. The semiconductor device of claim 1, wherein the second sidewall is protruded towards the second source/drain region from the sidewall of the first source/drain region.

7. The semiconductor device of claim 1, wherein a second surface opposite to the first surface of the dielectric pattern is substantially coplanar with a surface of the first source/drain region.

8. A semiconductor device, comprising:
a ferroelectric field-effect transistor (FeFET) comprising:
   a gate electrode;
   a channel layer on the gate electrode;
   a ferroelectric layer located between the channel layer and the gate electrode;
   a first source/drain region and a second source/drain region on the channel layer at opposite sides of the gate electrode; and
   a dielectric pattern inserted between the channel layer and the first source/drain region, wherein the dielectric pattern is partially covered by the first source/drain region and partially overlapped with the gate electrode.

9. The semiconductor device of claim 8, wherein a distance between the dielectric pattern and the second source/drain region is smaller than a distance between the first source/drain region and the second source/drain region.

10. The semiconductor device of claim 8, wherein the dielectric pattern is entirely overlapped with the gate electrode.

11. The semiconductor device of claim 8 further comprising a dielectric layer on the channel layer aside the first and second source/drain regions, wherein a k value of the first spacer is larger than a k value of the dielectric layer.

12. The semiconductor device of claim 8, wherein a portion of the dielectric pattern extends towards the second source/drain region beyond a sidewall of the first source/drain region.

13. The semiconductor device of claim 8, wherein the dielectric pattern is further inserted into the second source/drain region.

14. The semiconductor device of claim 8, wherein a surface of the first source/drain region is substantially coplanar with a surface of the dielectric pattern.

15. A manufacturing method of a semiconductor device, comprising:
forming a gate dielectric layer on a gate electrode;
forming a channel layer on the gate dielectric layer;
forming a dielectric pattern on the channel layer to overlap with the gate electrode;
forming a dielectric layer on the channel layer, the dielectric layer comprising a first opening and a second opening at opposite sides of the gate electrode, wherein the first opening partially exposes the dielectric pattern; and
forming a first source/drain region and a second source/drain region in the first opening and the second opening respectively, wherein the first source/drain region covers a first sidewall and a first surface of the dielectric pattern, and a second sidewall opposite to the first sidewall of the dielectric pattern is protruded from a sidewall of the first source/drain region.

16. The method of claim 15, wherein the first source/drain region is formed to cover the dielectric pattern.

17. The method of claim 15, wherein a material of the dielectric layer is different from a material of the dielectric pattern.

18. The method of claim 15, wherein the second opening further partially exposes the dielectric pattern.

19. The method of claim 15, wherein the dielectric pattern is formed to partially overlap with the gate electrode.

20. The method of claim 15, wherein the dielectric pattern is formed to entirely overlap with the gate electrode.

* * * * *